US010041993B2

(12) United States Patent
Hours et al.

(10) Patent No.: US 10,041,993 B2
(45) Date of Patent: Aug. 7, 2018

(54) SAFE OPERATING AREA CHECKING METHOD AND APPARATUS

(71) Applicants: Xavier Hours, Tournefeuille (FR); Aldric L'Hernault, Cugnaux (FR); Christophe Oger, Toulouse (FR); Mehul Shroff, Austin, TX (US)

(72) Inventors: Xavier Hours, Tournefeuille (FR); Aldric L'Hernault, Cugnaux (FR); Christophe Oger, Toulouse (FR); Mehul Shroff, Austin, TX (US)

(73) Assignee: NXP USA, Inc., Austin, TX (US)

( * ) Notice: Subject to any disclaimer, the term of this patent is extended or adjusted under 35 U.S.C. 154(b) by 347 days.

(21) Appl. No.: 14/917,100

(22) PCT Filed: Sep. 5, 2013

(86) PCT No.: PCT/IB2013/002405
§ 371 (c)(1),
(2) Date: Mar. 7, 2016

(87) PCT Pub. No.: WO2015/033180
PCT Pub. Date: Mar. 12, 2015

(65) Prior Publication Data
US 2016/0223608 A1    Aug. 4, 2016

(51) Int. Cl.
*G01R 31/00* (2006.01)
*G01R 31/28* (2006.01)
*G06F 17/50* (2006.01)

(52) U.S. Cl.
CPC ..... *G01R 31/2853* (2013.01); *G06F 17/5009* (2013.01)

(58) Field of Classification Search
CPC .................. G01R 31/2853; G06F 17/5009
USPC ............................................. 702/58; 365/222
See application file for complete search history.

(56) References Cited

U.S. PATENT DOCUMENTS

| 6,931,345 B1* | 8/2005 | Kim ................... G01R 31/2608 257/139 |
| 7,367,006 B1 | 4/2008 | O'Riordan et al. |
| 2003/0237035 A1 | 12/2003 | Bowers et al. |
| 2007/0157142 A1* | 7/2007 | Meyer ................. G06F 17/5081 716/112 |
| 2010/0153787 A1 | 7/2010 | Beattie, Jr. et al. |

(Continued)

OTHER PUBLICATIONS

Marquardt et al., "Topology-Aware ESD Checking: A New Approach to ESD Protection", Electrical Overstress/Electrostatic Discharge Symposium (EOS/ESD), 2012, ISBN 978-1-4673-1467-1, 6 pages.

(Continued)

*Primary Examiner* — Anthan Tran

(57) ABSTRACT

The use of a netlist or other database containing topological information of an electrical circuit comprising a multiplicity of components which are to undergo safe operating area (SOA) checking, permits a relationship between recorded SOA errors to be established. Knowing how such errors may be interdependent can assist designers in deciding which errors should be rectified first. The relationship between the recorded errors relating to two connected components may be modified by a confidence factor based on elapsed time between the occurrence of the two recorded errors.

11 Claims, 4 Drawing Sheets

(56) References Cited

U.S. PATENT DOCUMENTS

2012/0072810 A1* 3/2012 Yim .................... G06F 11/1008
714/785
2015/0121325 A1* 4/2015 Hours ................... G06F 11/261
716/107

OTHER PUBLICATIONS

Goldgeisser et al., "Modeling Safe Operating Area in Hardware Description Languages", DAC 2007 21.1, Jun. 4-8, 2007, pp. 377-382.
International Search Report for the International application No. PCT/IB2013/002405 dated Jun. 10, 2014.
Sobe et al., "Verification of Safe Operating Area (SOA) Constraints in Analog Circuits", 2008, 6 pages.

* cited by examiner

US 10,041,993 B2

SAFE OPERATING AREA CHECKING METHOD AND APPARATUS

FIELD OF THE INVENTION

This invention relates to a safe operating area checking method and apparatus.

BACKGROUND OF THE INVENTION

Typically, electronic devices are designed to operate under defined operating conditions. Such conditions are usually documented by manufacturers. Violation of the defined operating conditions may lead to degradation, malfunction or even destruction of a device. To mitigate this, the known technique of performing a "safe operating area check" (SOAC) may be implemented. In general, an SOAC traces the operating point of each device and reports a violation when a signal parameter such as a voltage or a current exceeds the limits defining the safe operating region. SOA (Safe Operating Area) errors may be generated during a circuit electrical simulation thereby notifying the designer when devices have been operated outside the allowed working conditions, such as voltage and current, for example. Typically, the devices concerned are technology primitives, consisting of transistors, capacitors, diodes, resistors, inductors, for example. Such primitives have an allowed range of operation and SOA errors may be reported when any of the allowed ratings are being exceeded. Recent developments in SOA management have extended the concept of error reporting to not only "fatal error" for which critical ratings are being violated, but also to "non-fatal" errors, such as "ageing" risks. An ageing risk may be considered to be the extent to which the lifetime of the products could be impacted by a safe operating condition violation. Such known safe operating area checks typically may report a large number of violations (or errors) which means that it can be very difficult for electronics system designers to determine which errors should be rectified first and how the errors may be interdependent.

SUMMARY OF THE INVENTION

The present invention provides a safe operating area checking method and apparatus as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
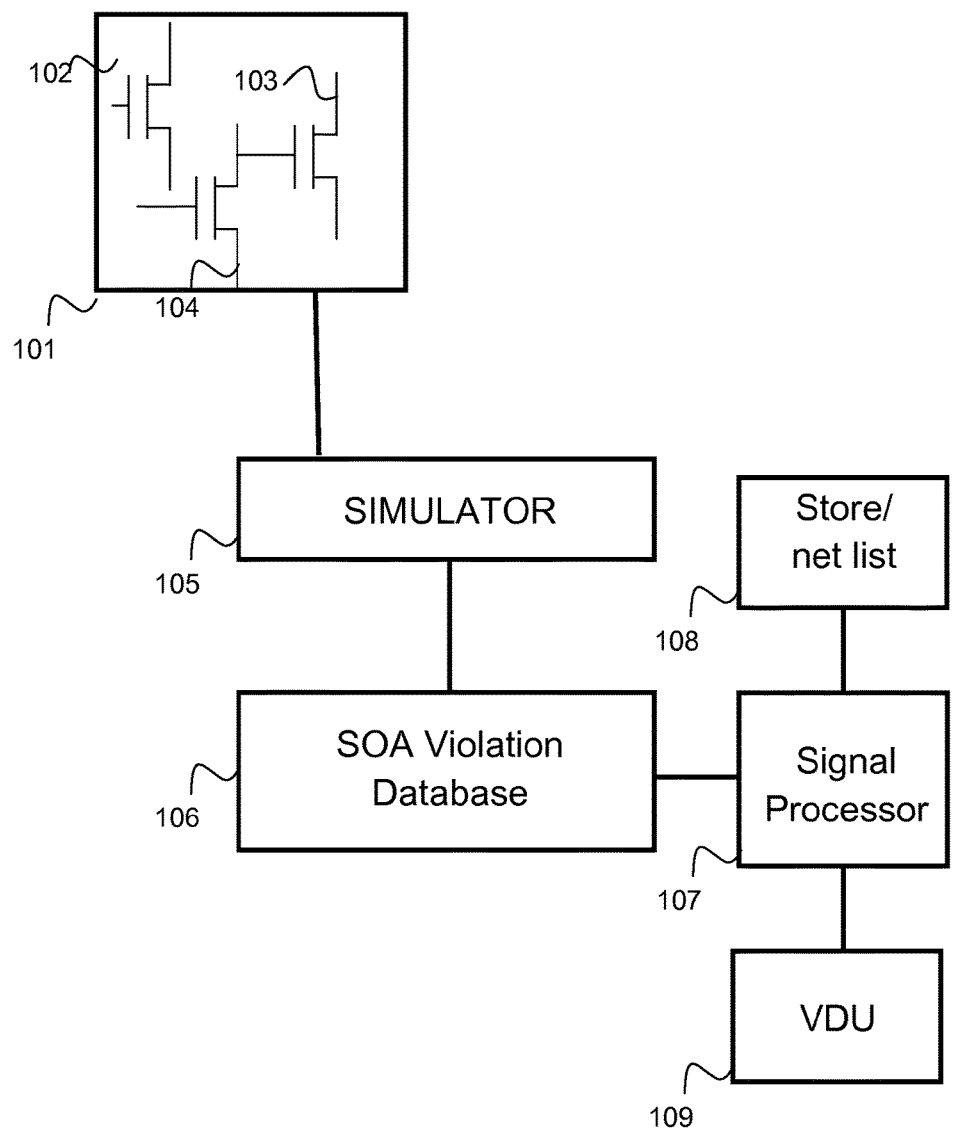
FIG. 1 is a simplified block diagram of a safe operating area checking system including an example of safe operating area checking apparatus.

Referring to FIG. 1, an electrical circuit (or system) 101 may comprise a plurality of devices 102, 103, 104. Each device may typically be capable of a "self-check." For example, the device 102 comprising an NMOS transistor may be capable of detecting an out-of-tolerance drain-to-source voltage. A simulator 105 may be operably coupled to the electrical circuit 101 and may be operated in accordance with known techniques in order to record SOA errors in respect of any device comprising the electrical circuit 101 which is operating outside its allowed operating area (or condition or rating).

The simulator 105 may, typically, be arranged to record one or more of the following parameters in respect of each device found to be operating outside its allowed rating. These recorded parameters may comprise; instance name/path, rule name, equation, start time stamp, stop time stamp, duration, maximum value, percentage of undershoot or overshoot, error score.

These recorded parameters may be stored in an SOA violation database 106 and may comprise an error log.

A signal processing module 107 may be operably coupled to the SOA violation database 106 and to a store 108. The store 108 may contain information relating to the topology of the electrical circuit 101. The store 108 may comprise a database representing the layout of the electrical circuit. One type of database may comprise a "netlist" Netlists are well known and the term generally applies to a non-graphical representation of a design that provides information about the components of a design and the connectivity of those components. A netlist may comprise a file that specifies the components and connectivity of a network. That is to say that it includes physical properties of the components (passive and active) as well as geographical information regarding how the components are connected to one another and to external ports. A netlist may be hierarchical comprising blocks which may be instantiated at multiple locations. An instance may be uniquely referred to by its instance name and position in the hierarchy. So in one example embodiment, by interrogating the store 108, it may be determined that the device 103 is connected to second device 104 and that this second device 104 is "upstream" of the device 103.

In one example embodiment, the signal processor 107 may be arranged to retrieve SOA errors from the SOA violation database and also may be arranged to retrieve circuit topology information from the store 108.

The signal processor 107 may be arranged to generate an output comprising SOA violation data which may be in the form of an error log for display to a user on a visual display unit (VDU) 109.

In one embodiment, the signal processor 107 may be arranged to link errors which occur in two or more devices which are operably coupled to one another. In this way, SOA errors which relate to two or more devices which are connected to one another may be considered to belong to the same error "stream." Such errors may be considered to be "chained."

In an example embodiment, the signal processor 107 may be arranged to process at least in part of the output of the simulator 105 (which may be stored in the SOA violation database) such that it adds a field which includes a stream identifier which indicates that a particular SOA error belongs to a certain error stream. In one example, a stream identifier may be a number. In one example, a stream field may be added when a next instance error occurs on a device connected to the previous one in the stream. The signal processor 107 may generate an output for display on the VDU 109 such that for any stream, any errors belonging to that stream are ordered depending on the time of occurrence. The signal processor 107 may generate an output for display on the VDU such that streams are ordered depending on the time the first error belonging to a new stream was detected. In this way, a user may identify the first listed error in a stream as the start time of a new stream. Also, this may enable the user to assign priority to the first listed error in a stream. Knowing the identity of the first occurring error in a steam may further assist the user in identifying the cause of all errors in that stream. The signal processor 107 may generate an output for display on the VDU such that error stream information may be presented in a tree-like fashion with collapse and expand capabilities to ease reading.

Thus, a circuit topology may be used in order to combine and rank safe operating area errors. The errors may be chained together by streams. In one embodiment, the signal processor 107 may be arranged to generate an output for display on the VDU 109 which represents a dependency confidence chain between errors. This has the advantage of enabling the designer to prioritise the display errors. In some example embodiments, the signal processor 107 may be provided with a sorting capability which may sort errors against information relating to the topology of the circuit.

In one example embodiment, the signal processor 107 may be arranged to parse the error log, retrieved from the SOA violation database 106, error by error. For each error, an analysis based on the circuit topology (retrieved by the signal processor 107 from the store 108) may be performed in order to determine how to treat the next error. That is for example: either assign it to an existing error stream if it was identified as being linked to errors already reviewed, or create a new stream and set the current error as "first to occur" in that new stream.

Figure 2:
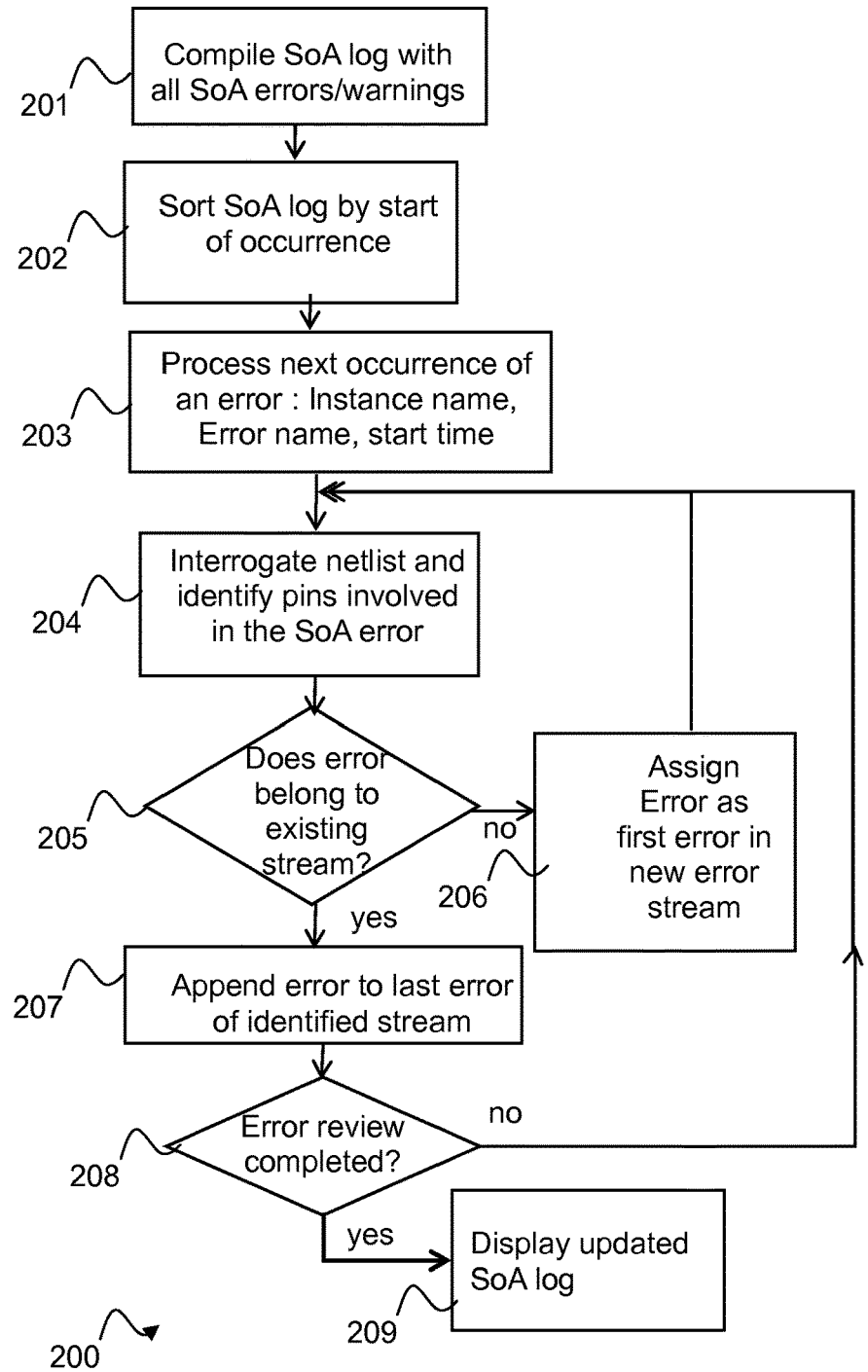
FIG. 2 is a simplified flowchart illustrating a first exemplary method of safe operating area checking.

Referring now to FIG. 2 which is an example of a safe operating area checking method 200; at 201, a safe operating area log containing safe operating area errors and warnings relating to a plurality components included in an electrical circuit may be compiled.

At 202, the SOA error log may be sorted by start of occurrence.

At 203, an occurrence of an error may be processed including instance name, error name and start time.

At 204, a netlist comprising topological information of the electrical circuit and its components may be interrogated and from the error name, the pins of a component which was involved in an SOA error may be identified.

At 205, it may be determined whether or not the current error belongs to an existing error stream comprising errors previously reviewed.

If this is not the case then at 206, the current error may be assigned as being a first error in a new error stream. This new error stream may be assigned a stream number. The method may subsequently revert to 204 where the relevant topological information and pin identity may be determined for the next occurring error.

If on the other hand the current error does belong to an existing error stream, then at 207, the current error is appended to the existing stream and may be assigned with the existing stream's number.

If, at 208, the error log review remains uncompleted, then the method may revert to 204 where the relevant topological information and pin identity may be determined for the next occurring error.

Once the error log review has been completed, at 209, an error log which may include a stream number for each error may be displayed on a visual display unit.

Figure 3:
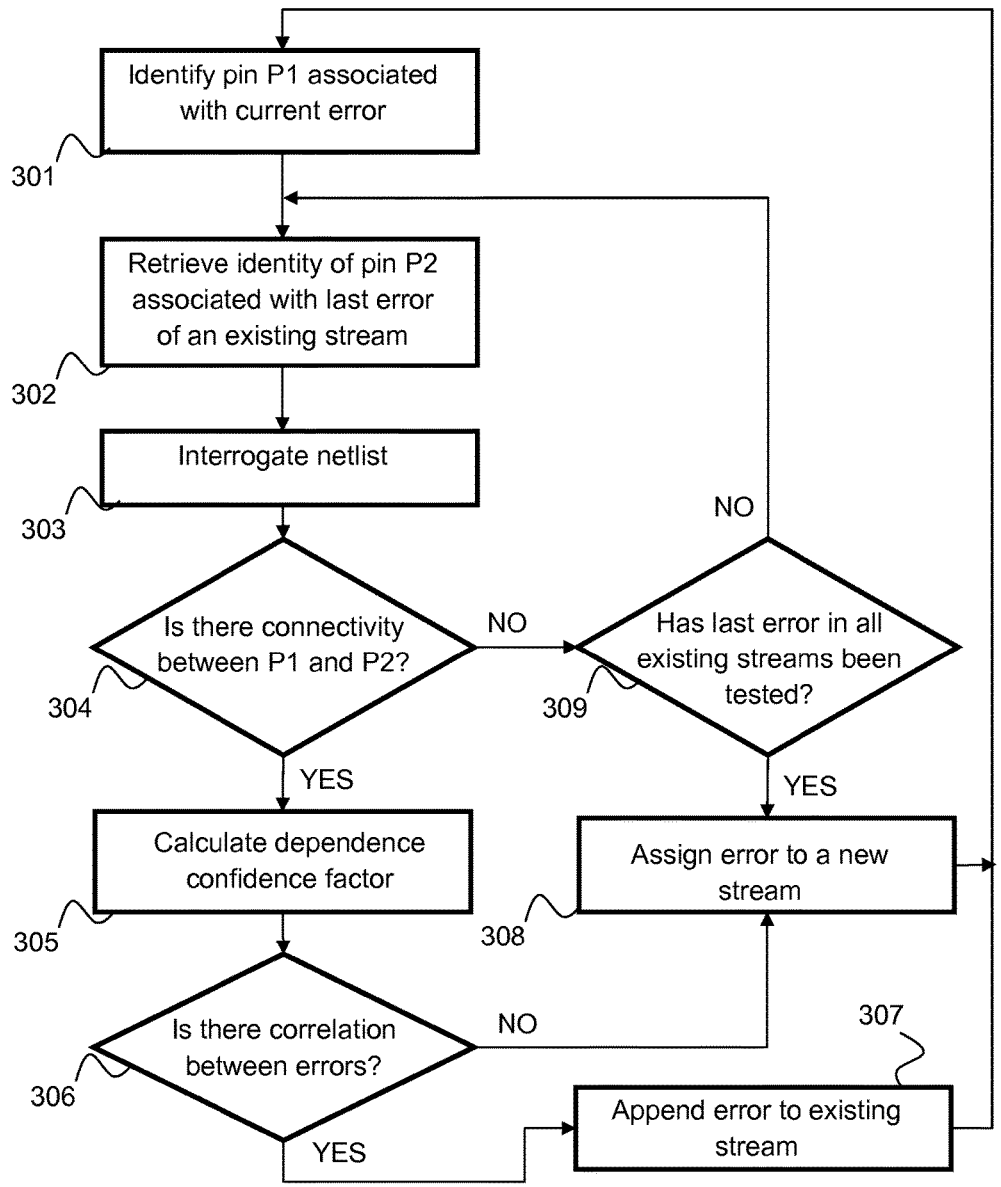
FIG. 3 is a simplified flowchart illustrating a second exemplary method of safe operating area checking.
Figure 4:
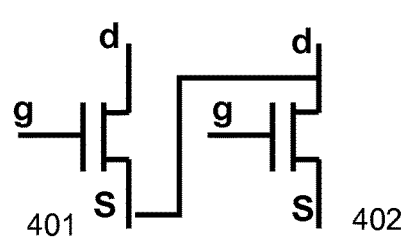
FIG. 4 and FIG. 5 are simplified circuit diagrams of components suitable for undergoing a safe operating area checking method.

An example of a method 300 for determining if a correlation exists between SOA errors will now be described with reference to FIGS. 3, 4 and 5. In this example, a check for a correlation of a current error with the last logged error of all existing error streams may be performed.

At 301, a pin P1 associated with a current error may be identified. In this example, say that the pin P1 associated with the current error is the source of a transistor 401 (see FIG. 4) and the current error recorded is a gate-source voltage violation.

At 302, the identity of a pin P2 associated with the last recorded error of an existing stream may be retrieved from the error log. As an example, say that a first existing stream includes five recorded errors and the last (fifth) error relates to the drain pin of transistor 402 (see FIG. 4) for which a gate-drain voltage violation was recorded.

At 303, a circuit netlist may be interrogated to determine (at 304) if any connectivity exists between the pin P1 associated with the current error and the pin P2 associated with the last recorded error in the first existing stream. In this example, the netlist may reveal that the source pin of transistor 401 is connected to the drain pin of transistor 402 (see FIG. 4).

In some example embodiments, identifying a connectivity may be based on a violation name and netlist parsing.

Identifying a connectivity may follow predetermined rules. For example, connectivity through ground/earth connections may not be enabled and connectivity through supply pins and rails may be disregarded. Connectivity through a resistor or other passive device may be considered. Generally a connectivity may be deemed to exist between two points (or pins or "nodes") in a circuit if there is continuity of current flow between them.

Connectivity may be identified hierarchically. For example, blocks representing a function in the electrical circuit 101 may instantiate sub-blocks, they themselves instantiating the devices under consideration for SOA checking. The connectivity between two devices pertaining to different blocks or sub-blocks may be established at any level of hierarchy between the blocks or sub-blocks, and such arrangements may make use of the example embodiments.

In cases where a connectivity has been identified, at 305 a dependence confidence factor may be calculated in respect of the current error. A dependence confidence factor may be calculated (in the signal processor 107 of FIG. 1 for example) by the following process. Firstly, the elapsed time (delta value) between the occurrence of the current error and that of the last (fifth) error of the existing (first) stream may be determined from the error log. Secondly, the determined delta value may be compared with a preset threshold to determine if there is any correlation between the errors (at 306). If the delta value is found to be below the threshold then a dependence confidence factor may be deemed to be high enough to indicate a correlation between the errors. In such a case, at 307, the current error may be appended to the first existing stream and now becomes the last (sixth) recorded error in the stream. If the result of the comparison revealed that the delta value is above the preset threshold, then a dependence confidence factor may be deemed to show that there is no correlation between the errors.

Although the threshold value may be preset, it may also be varied in order to set different levels for the dependence confidence factor.

In cases where no correlation between errors is found, then at 308 the current error may be assigned as the first error occurring in a new stream.

Subsequent to 307 and 308, the method may revert to 301 where the next error may be processed.

Figure 5:
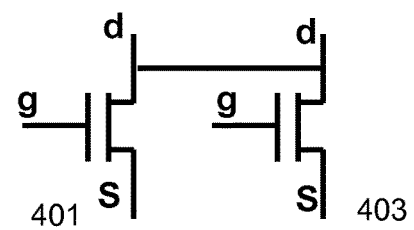

Referring back to 304 where it is to be determined whether connectivity exists between a pin P1 associated with a current error and one associated with an error belonging to an existing error stream; consider an example where the pin P1 associated with the current error is again the source of the transistor 401 (see FIG. 5). However, in this example, say that the pin P2 which is associated with the last recorded error in an existing stream is the drain of a transistor 403 (see FIG. 5). The netlist reveals, in this example that the drains of the two transistors 401 and 403 are connected to one another but the drain of transistor 403 is not connected to the source of transistor 401. So in this example, there is no connectivity and so no correlation between the errors.

In such case, the method may proceed to 309 where it may be determined if the last recorded errors in all existing streams have been tested for correlation with the current error. If not, then the method may revert to 302 where the last recorded error (relating to a circuit component) of another existing stream may be tested for correlation with the current error.

Once all last recorded errors associated with all existing streams have been tested for correlation with the current error the method may revert to 301 where the next SOA error may processed.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

As an example, a tangible computer program product may be provided having executable code stored therein to perform a safe operating area checking method in accordance with the appended claims.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

For example, the connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the signal processor 107 and the netlist 108 may be implemented in a single module or two discrete modules. Furthermore, the signal processor 107 and/or netlist 108 may be included in the simulator 105.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Further, the entire functionality of the signal processor 107 shown in FIG. 1 may be implemented in an integrated circuit That is to say that apparatus for safe operating area checking may be implemented in an integrated circuit. Such an integrated circuit may be a package containing one or more dies. Alternatively, the examples may be implemented as any number of separate integrated circuits or separate devices interconnected with each other in a suitable manner. An integrated circuit device may comprise one or more dies in a single package with electronic components provided on the dies that form the modules and which are connectable to other components outside the package through suitable connections such as pins of the package and bondwires between the pins and the dies.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A safe operating area checking method comprising: receiving safe operating area errors in respect of a plurality of circuit components; determining if a connectivity exists between a first component having a first safe operating area error associated therewith, said first safe operating area error having a first identity assigned thereto, and a second component having a second safe operating area error associated therewith, by interrogating a store containing circuit topology information; and if connectivity exists, assigning the first identity to the second safe operating area error and if no connectivity exists, assigning a new identity to the second safe operating area error.

2. The safe operating area checking method of claim 1 wherein the first safe operating area error is the last recorded error of a first stream of errors, each error in said first stream having said first identity assigned thereto.

3. The safe operating area checking method of claim 1 comprising: if connectivity exists between the first and second components, determining an elapsed time between an occurrence of the first safe operating area error associated with the first component and the second safe operating area error associated with the second component, and determining a confidence factor depending upon the comparison between the elapsed time and a preset threshold value.

4. The safe operating area checking method of claim 3, comprising: if the determined confidence factor meets a predetermined criterion, assigning the first identity to the second safe operating area error and if the confidence factor fails to meet the predetermined criterion, assigning a new identity to the second safe operating area error.

5. The safe operating area checking method of claim 1 wherein if no connectivity exists between the first and second components, determining if connectivity exists between the second component and a third component, wherein said third component has a third safe operating area error associated therewith which is the last recorded error of a second stream of errors, each error in the second stream having a second identity assigned thereto.

6. Safe operating area checking apparatus for a circuit comprising a plurality of components, the apparatus comprising: a signal processor; and a store containing circuit topology information, the signal processor being arranged to determine if a connectivity exists between a first component having a first safe operating area error associated therewith, said first safe operating area error having a first identity assigned thereto, and a second component having a second safe operating area error associated therewith, by interrogating the store, and if connectivity exists, assign the first identity to the second safe operating area error and if no connectivity exists, assign a new identity to the second safe operating area error.

7. The safe operating area checking apparatus of claim 6 wherein the first safe operating area error is the last recorded error of a first stream of errors, each error in said first stream having said first identity assigned thereto.

8. The safe operating area checking apparatus of claim 6, wherein if connectivity exists between the first and second components, the signal processor is arranged to determine an elapsed time between an occurrence of the first safe operating area error associated with the first component and the second safe operating area error associated with the second component, and determine a confidence factor depending upon the comparison between the elapsed time and a preset threshold value.

9. The safe operating area checking apparatus of claim 8, wherein the signal processor is arranged to assign the first identity to the second safe operating area error if the determined confidence factor meets a predetermined criterion, and assign a new identity to the second safe operating area error if the confidence factor fails to meet the predetermined criterion.

10. The safe operating area checking apparatus of claim 6 wherein the signal processor is arranged to determine if connectivity exists between the second component and a third component, wherein said third component has a third safe operating area error associated therewith which is the last recorded error of a second stream of errors, each error in the second stream having a second identity assigned thereto, if no connectivity exists between the first and second components.

11. The safe operating area checking apparatus of claim 6 wherein the signal processor is implemented in an integrated circuit device.

\* \* \* \* \*